(12) United States Patent
Scanlan et al.

(10) Patent No.: US 6,656,848 B1
(45) Date of Patent: Dec. 2, 2003

(54) PLASMA CHAMBER CONDITIONING

(75) Inventors: John Scanlan, Waterford (IE); Kevin O'Leary, Lucan (IE); Barry Coonan, Dublin (IE)

(73) Assignee: Scientific Systems Research Limited, Dublin (IE)

( * ) Notice: Subject to any disclaimer, the term of this patent is extended or adjusted under 35 U.S.C. 154(b) by 12 days.

(21) Appl. No.: 10/133,931

(22) Filed: Apr. 26, 2002

(30) Foreign Application Priority Data

Feb. 22, 2002 (IE) ............................................. 2002/0141

(51) Int. Cl.$^7$ ............................................. H01L 21/302

(52) U.S. Cl. ...................... 438/710; 438/712; 438/714; 438/716

(58) Field of Search ................................. 438/710, 714, 438/716, 712, 718

(56) References Cited

U.S. PATENT DOCUMENTS

| | | | | |
|---|---|---|---|---|
| 5,458,732 A | * | 10/1995 | Butler et al. | 216/61 |
| 5,985,375 A | * | 11/1999 | Donohoe et al. | 427/492 |
| 6,252,354 B1 | * | 6/2001 | Collins et al. | 315/111.51 |
| 6,441,620 B1 | * | 8/2002 | Scanlan et al. | 324/459 |
| 6,455,437 B1 | * | 9/2002 | Davidow et al. | 438/710 |

* cited by examiner

Primary Examiner—Robert Kunemund
Assistant Examiner—Binh X. Tran
(74) Attorney, Agent, or Firm—Alston & Bird LLP

(57) ABSTRACT

A method for determining the optimum number of conditioning wafers to be run following a wet clean of the walls of an RF plasma chamber 1 is based on an electrical precursor signal. Polymer build up on a plasma chamber wall during normal chamber conditioning is monitored by observing components of the fundamental RF signal. After a pre-determined number of wafers has been run, a predictive model is used to determine the total number of wafers needed to complete the conditioning cycle.

2 Claims, 4 Drawing Sheets

PLASMA CHAMBER CONDITIONING

BACKGROUND OF THE INVENTION

1. Field of the Invention

The present invention relates to a method of conditioning an RF-powered plasma processing chamber after cleaning the interior chamber walls.

2. Prior Art

Many thin film processes use plasma processes to facilitate the rapid and accurate fabrication of minute structures with desired properties. Plasma processes include the deposition and etching of insulators, conductors and semiconductors on a substrate, for example, a silicon wafer. The plasma process usually involves placing the substrate in a vacuum chamber, introducing process gases and applying radio-frequency (RF) power, typically 0.1 to 200 MHz, to create a plasma. The plasma consists of ions, electrons, radical gas species and neutral gas, all of which permit the desired reaction to proceed. The plasma reaction has many inputs, including RF power, gas type and flow rates, chamber pressure, substrate and wall temperatures, chamber wall conditions, electrode spacing, and so on.

The chamber configuration and chemistry used is chosen according to the desired process. For example, plasmas are used to etch dielectrics in semiconductor manufacture using specific plasma chamber designs such as Reactive Ion Etching (RIE) or Inductively Coupled Plasma (ICP) and using etching gases such as $CHF_3$, $CF_4$, $O_2$ and so on.

During the manufacturing process, by-products of the reaction process, for example polymers, are deposited on the walls of the chamber. Typically, a wet clean is performed to remove these by-products. If this material were not periodically removed, it would eventually flake, depositing particles onto the wafer surface, and impacting yield.

When the reactor walls have been cleaned, and vacuum integrity has been restored, the chamber undergoes a conditioning process, during which non-product (conditioning) wafers are cycled through the chamber according to a predetermined conditioning recipe. As is well-known in the art, a conditioning wafer is a non-product wafer with a substrate which is similar to that used in production on the same chamber, for example polysilicon, silicon dioxide, silicon nitride or bare silicon. A conditioning recipe is a recipe similar or identical to that used in production on the same chamber, and is also referred to as a burn-in recipe. The objective of conditioning is to deposit an initial layer of polymer material on the clean chamber walls. If the chamber is not conditioned in this way, the first number of production wafers experience significantly different process conditions, resulting in yield loss.

After the conditioning cycle, a test or qualification wafer may be run through the chamber to confirm that process conditions have reached equilibrium. If not, the chamber is conditioned further. The operator of the chamber does not know exactly how many conditioning wafers are needed to restore process conditions. Operating procedures usually call for a fixed number of conditioning wafers to be run on all chambers of the same type. For example, it may be that twenty-five wafers each running the conditioning recipe for one minute is advised. This is not an optimal method, since equilibrium conditions are often unpredictable, being a function of wafer grade, chamber configuration or the time the chamber has been exposed to atmosphere.

Preventive maintenance is classified as downtime, during which no production wafers can be processed in the chamber. The conditioning step of the preventive maintenance activity can constitute a large percentage of the total preventive-maintenance downtime, thus incurring a significant cost. There is a need therefore, for some method of determining when a chamber is conditioned, and ideally advising operators in advance.

It is known that certain electrical signals derived from the plasma power source can be sensitive to many plasma processing events. The plasma represents a non-linear complex load in electrical terms. This results in the generation of harmonics of the RF driving signal. These harmonics, known as Fourier components, are very sensitive to changes both in the plasma process and the process parameters. It is generally accepted that monitoring the Fourier components of the RF power signal provides a useful way to monitor the plasma process. These components are a more direct measurement of the plasma process since they are more directly related to fundamental plasma parameters.

It is known to use an RF sensor to monitor and control RF plasmas by measuring the Fourier components of voltage and current. The sensor can be used in closed or open loop control, as for example, in etch end-point control or as in-situ monitoring of the plasma process. In either case the plasma can be terminated when one or more of the RF Fourier components reaches pre-determined limits.

In particular, it has been suggested ("Measurement of discharge impedance for dry etch process control", F. Bose et al., SPIE Proceedings, vol 2336, pp101–110, 1994) that chamber conditioning can be stopped when the RF parameters reach a pre-determined stable value. The concept is that wall conditions have stabilised. One limitation of this approach is that the operator of the chamber has no advance warning of when this event may occur, and cannot decide to continue conditioning the chamber, load qualification wafers or load production wafers into the tool. It would be much more useful for the operators of plasma-processing chambers to have a system that predicted the number of conditioning wafers needed.

SUMMARY OF THE INVENTION

Accordingly, the present invention provides a method of conditioning an RF-powered plasma processing chamber comprising the following steps:

(a) after cleaning the interior chamber walls, running a pre-determined number of conditioning wafers successively through the chamber each using substantially the same conditioning recipe;

(b) in respect of each such conditioning run, determining the magnitude of a Fourier component of the delivered RF power;

(c) based on the magnitudes determined in step (b), building a predictive model of Fourier component magnitude as a function of the number of conditioning wafers run; and (d) determining the number of conditioning wafers needed to be run for the rate of change of the predicted magnitude of the Fourier component to reach a pre-determined threshold level.

This invention provides several advantages over the existing known methods. Firstly, the number of conditioning wafers may be optimised so that the amount of downtime is minimised. Secondly, the number of qualification wafers is reduced as these wafers are loaded only when the predictive model indicates that the chamber will reach equilibrium.

BRIEF DESCRIPTION OF THE DRAWINGS

An embodiment of the invention will now be described, by way of example, with reference to the accompanying drawings, wherein.

DETAILED DESCRIPTION OF A PREFERRED EMBODIMENT

Figure 1:
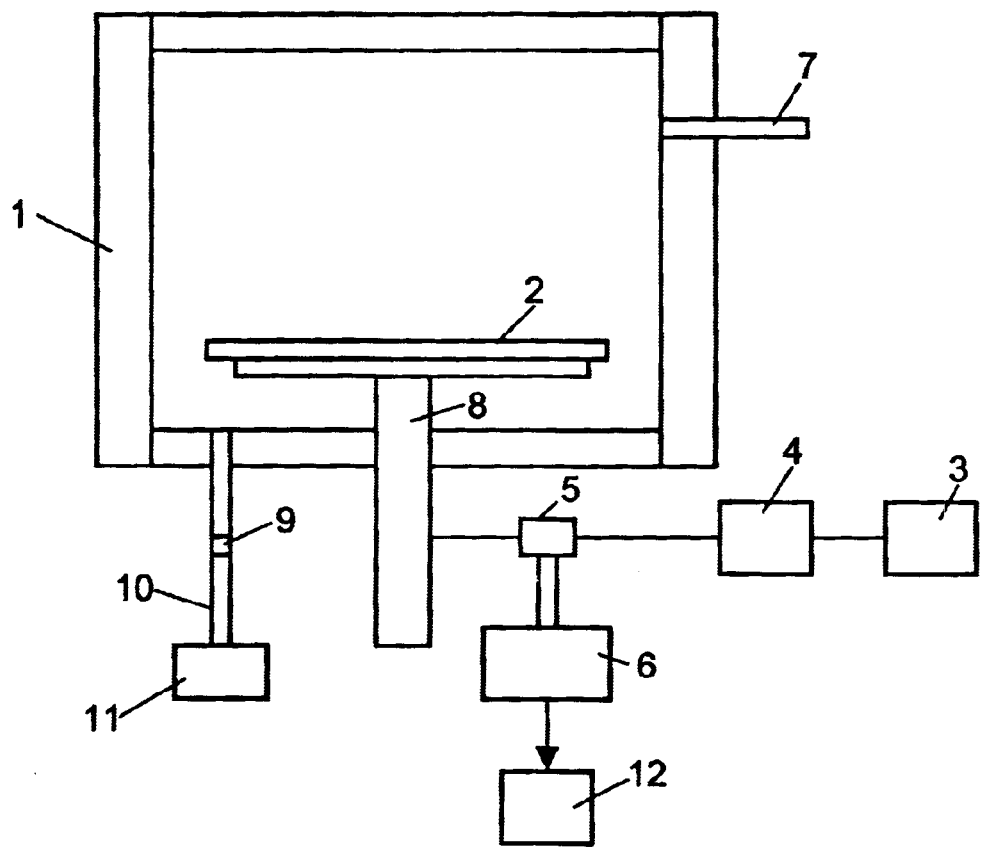
FIG. 1 depicts a typical plasma process chamber.

FIG. 1 shows a typical plasma process reactor. It includes a plasma chamber 1 containing a wafer or substrate 2 to be processed. A plasma is established and maintained within the chamber by an RF power source 3. This source generally has real impedance which must undergo a transformation to match that of the complex plasma load. This is done via match network 4. Power is coupled to the plasma chamber, typically by capacitive coupling, through an electrode 8. However, the invention also applies to systems that have more than one capacitive electrode, those that are inductively coupled or transformer coupled, helical/helicon wave systems and electron-cyclotron resonance systems. Process gases are admitted through gas inlet 7 and the chamber is maintained at a desired process pressure by removing process gases and by-products through gas exhaust line 10 using pump 11. A throttle valve 9 may be used to control process pressure in an automatic control loop.

The wafer is processed according to some recipe, which is controlled by the chamber operator. This recipe includes input parameter settings such as process gas types and flow rates, chamber pressure, substrate/wall temperatures, RF power settings on one or more power generators, recipe time, inter-electrode spacing, etc. This is the case for all plasma processing tools, such as etch, deposition, etc. The wafer will undergo very many plasma process steps before completion. Each step contributes to the overall product yield; a fault at any one step may destroy potential product.

Referring again to FIG. 1, an RF sensor 5 is used to measure the voltage and current of the RF electrical power signal in the complex post-match electrical line. A Fourier Transform is performed in data collection electronics 6 using a sampling technique which extracts the Fourier components of the voltage and current and the phase angle between these vectors. This data sampling should have sufficiently high resolution to determine Fourier components (in this embodiment the first five including the fundamental) across a very large dynamic range (90 dB) with phase resolution of up to 0.001 degree. Suitable techniques for high resolution sampling and measurement of Fourier components are described in U.S. Pat. No. 5,808,415.

The output of the data collection electronics 6 is connected to a controller 12 which may be a computer or other system which uses the signals to yield information about and/or control the plasma process.

In an embodiment of the inventive method the controller 12 builds a predictive model for determining when wall conditioning of the chamber should stop following a wet clean of the interior chamber walls. In the embodiment it is assumed that in production the chamber 1 is used to plasma etch silicon dioxide selectively from poly-silicon wafers using polymer-forming chemistry, a process which leads to polymer build-up on the interior chamber walls. Following a wet clean, therefore, it is necessary during conditioning to deposit polymer on the interior walls until equilibrium conditions are established for subsequent production use.

The method starts immediately after a wet clean of the interior chamber walls by running a predetermined number of conditioning wafers, in this embodiment 12 such wafers, successively through the chamber using the same conditioning recipe. In this embodiment the conditioning wafers are polysilicon wafers and the conditioning recipe is a multi-step recipe with a $CF_4$-based oxide-breakthrough step, followed by an etch step with HBr and $Cl_2$ chemistry. In respect of each such conditioning run the impedance of the fundamental component of the delivered RF power, as sensed by the sensor 5, was determined and recorded by the electronics 6 and controller 12.

Figure 2:
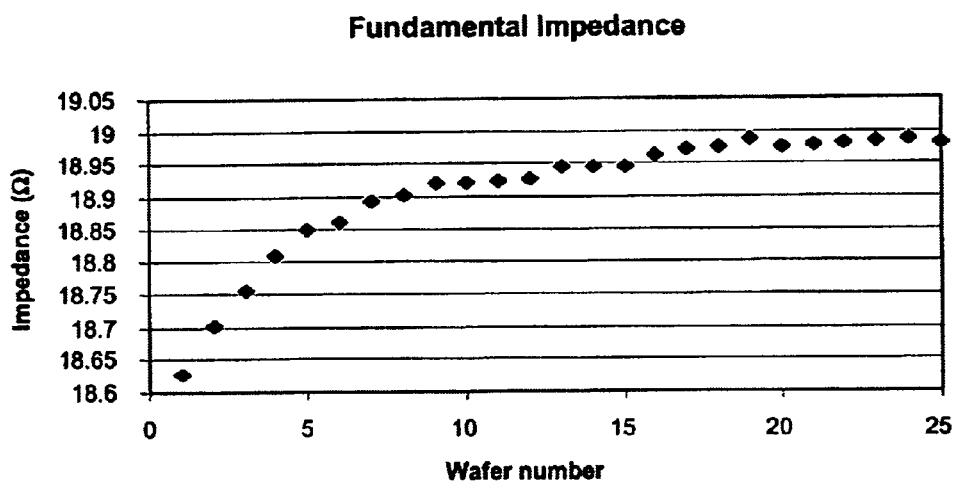
FIG. 2 shows RF impedance at the fundamental frequency as a function of conditioning wafer number.

FIG. 2 shows the variation in RF impedance of the fundamental component of the RF signal, in this embodiment 13.56 MHz. There is a clear trend in the data showing a strong correlation between the impedance and the number of condition wafers run after the wet clean. The change in impedance is due to the build-up of polymer layers in the process chamber which alter the electrical characteristics of the chamber.

Figure 3:
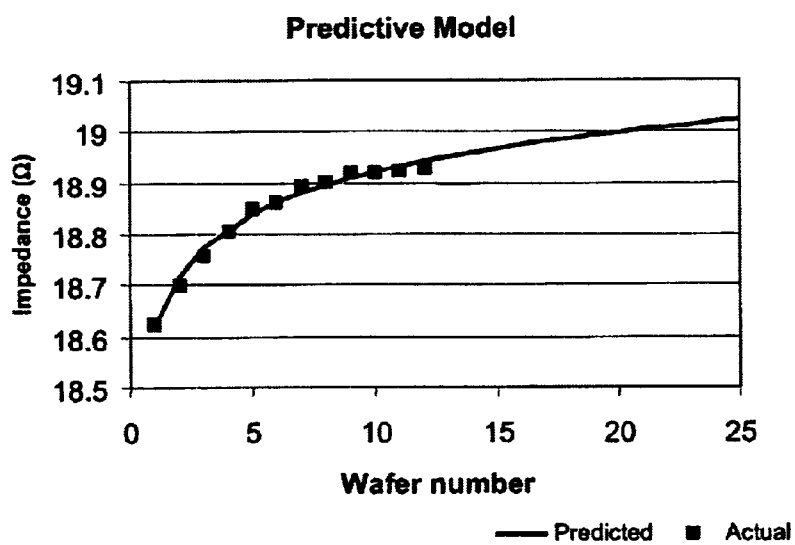
FIG. 3 shows the RF impedance at the fundamental frequency as function of conditioning wafer number for the first twelve wafers only. It also shows a predictive model.

According to the embodiment, a predictive model of chamber impedance is built using the initial 12 conditioning runs referred to above. FIG. 3 shows the result of a predictive first order model of fundamental impedance based on these 12 wafers. It can be seen that this model accurately predicts how the impedance of the chamber will evolve as the remaining conditioning wafers are run. The model depends on the pre-determined number of wafers used to build it, which in turn varies as a function of chamber type, conditioning chemistry and the duration of the etch step on each wafer.

The model can be any predictive model of impedance based on wafer count. In this embodiment, it is an equation of the form $y=a/x^b+c$, where the impedance y is predicted from the wafer count x. The constants a, b and c are calculated by minimizing the least-squares error between the predicted impedance y, and the actual impedance recorded on the first number of wafers—in this embodiment twelve wafers.

Figure 4:
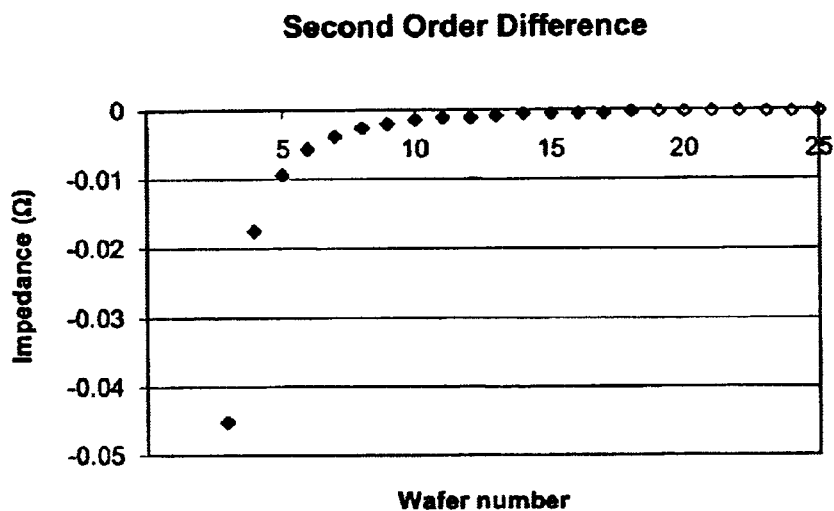
FIG. 4 shows the second order difference of RF impedance at the fundamental frequency as a function of conditioning wafer number.

A threshold level is set by choosing the point at which the rate of change of predicted impedance reaches a predetermined value, indicating when the chamber has reached a stable operating regime. The chamber operator is informed how many more conditioning wafers should be run to reach this point. FIG. 4 shows the second-order difference of fundamental impedance as predicted by the model. In this embodiment the trigger value is set to 0.0004. The model predicts that this value will be exceeded at wafer 19, and conditioning should be stopped at this point. The figure also shows how running six more wafers does not significantly change the chamber condition.

Figure 5:
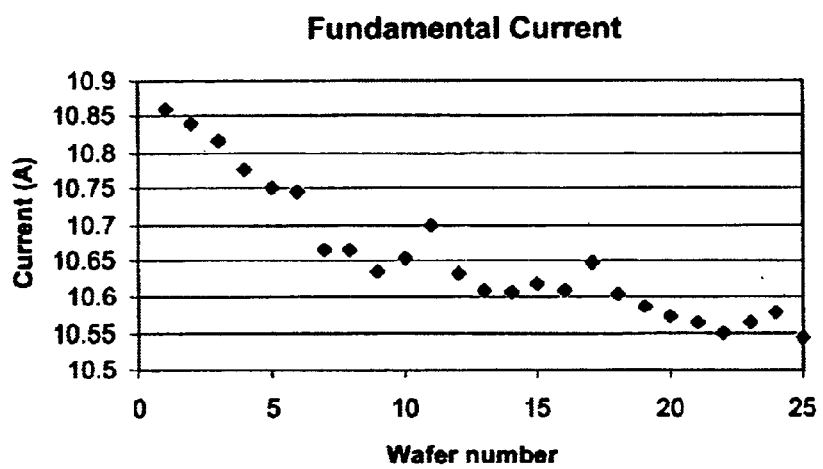
FIG. 5 shows RF current at the fundamental frequency as a function of conditioning wafer number.
Figure 6:
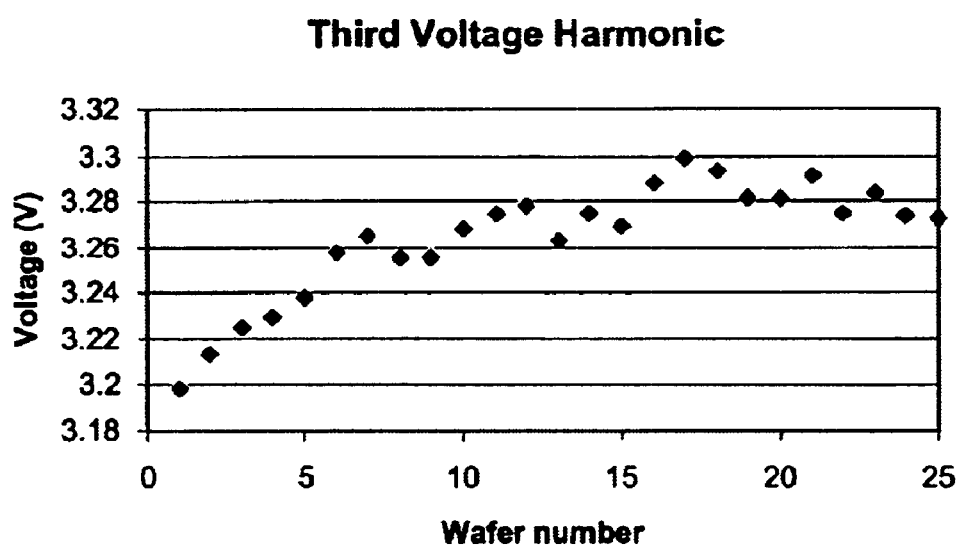
FIG. 6 shows the third harmonic of RF voltage as a function of conditioning wafer number.

While this particular embodiment makes use of the fundamental impedance of the RF as the sole model parameter, it is also possible to additionally or alternatively use one or more other RF components, such as current, voltage or phase, including components at frequencies other than the fundamental frequency (i.e. harmonics). For example, FIG. 5 shows the trend in RF current at the fundamental frequency and FIG. 6 shows RF voltage at the third harmonic. In both cases there is a clear trend as a function of the number of conditioning wafers run, indicating that each of these components could be used in the model.

The present invention, although described for a semiconductor process, can be applied to any plasma process, including the fabrication of flat panel displays, optical components, memory devices and any other process using a plasma.

The invention is not limited to the embodiments described herein which may be modified or varied without departing from the scope of the invention.

What is claimed is:

1. A method of conditioning an RF-powered plasma processing chamber comprising the following steps:

(a) after cleaning the interior chamber walls, running a pre-determined number of conditioning wafers successively through the chamber each using substantially the same conditioning recipe;

(b) in respect of each such conditioning run, determining the magnitude of a Fourier component of the delivered RF power;

(c) based on the magnitudes determined in step (b), building a predictive model of Fourier component magnitude as a function of the number of conditioning wafers run; and (d) determining the number of conditioning wafers needed to be run for the rate of change of the predicted magnitude of the Fourier component to reach a pre-determined threshold level.

2. The method of claim 1, wherein the conditioning recipe is one which deposits a polymer on the walls of the chamber.

* * * * *